United States Patent
Park et al.

(10) Patent No.: US 7,157,770 B2
(45) Date of Patent: Jan. 2, 2007

(54) MOS TRANSISTOR WITH RECESSED GATE AND METHOD OF FABRICATING THE SAME

(75) Inventors: Jong-Chul Park, Gyeonggi-do (KR); Jong-Heui Song, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/884,223

(22) Filed: Jul. 1, 2004

(65) Prior Publication Data
US 2005/0035427 A1    Feb. 17, 2005

(30) Foreign Application Priority Data
Aug. 13, 2003  (KR) ................. 10-2003-0056264

(51) Int. Cl.
*H01L 29/76* (2006.01)
(52) U.S. Cl. .................. 257/330; 257/510
(58) Field of Classification Search ............. 257/510, 257/330, 332, 333; 438/424
See application file for complete search history.

(56) References Cited
U.S. PATENT DOCUMENTS

| | | | | |
|---|---|---|---|---|
| 4,551,743 A * | 11/1985 | Murakami | ............... | 257/513 |
| 4,845,048 A * | 7/1989 | Tamaki et al. | ............... | 438/410 |
| 5,891,807 A * | 4/1999 | Muller et al. | ............... | 438/713 |
| 5,915,192 A * | 6/1999 | Liaw et al. | ............... | 438/435 |
| 5,933,749 A * | 8/1999 | Lee | ............... | 438/435 |
| 6,261,957 B1 * | 7/2001 | Jang et al. | ............... | 438/692 |
| 6,277,707 B1 * | 8/2001 | Lee et al. | ............... | 438/430 |
| 6,313,008 B1 * | 11/2001 | Leung et al. | ............... | 438/424 |
| 6,465,842 B1 * | 10/2002 | Nishinohara | ............... | 257/330 |
| 6,548,374 B1 * | 4/2003 | Chung | ............... | 438/424 |
| 2002/0072197 A1 * | 6/2002 | Kang et al. | ............... | 438/424 |
| 2004/0099906 A1 * | 5/2004 | Ji et al. | ............... | 257/332 |

\* cited by examiner

*Primary Examiner*—T. N. Quach
(74) *Attorney, Agent, or Firm*—Marger Johnson & McCollom, P.C.

(57) ABSTRACT

A MOS transistor with a recessed gate and a method of fabricating the same: The MOS transistor comprises a semiconductor substrate, and a trench isolation layer located in a predetermined region of the semiconductor substrate for defining an active region. The trench isolation layer has a negative slope on at least a lower sidewall thereof. A recessed gate is located in a predetermined region of the active region, and a bottom surface of the recessed gate is placed adjacent the negatively slopped sidewall of the trench isolation layer.

9 Claims, 10 Drawing Sheets

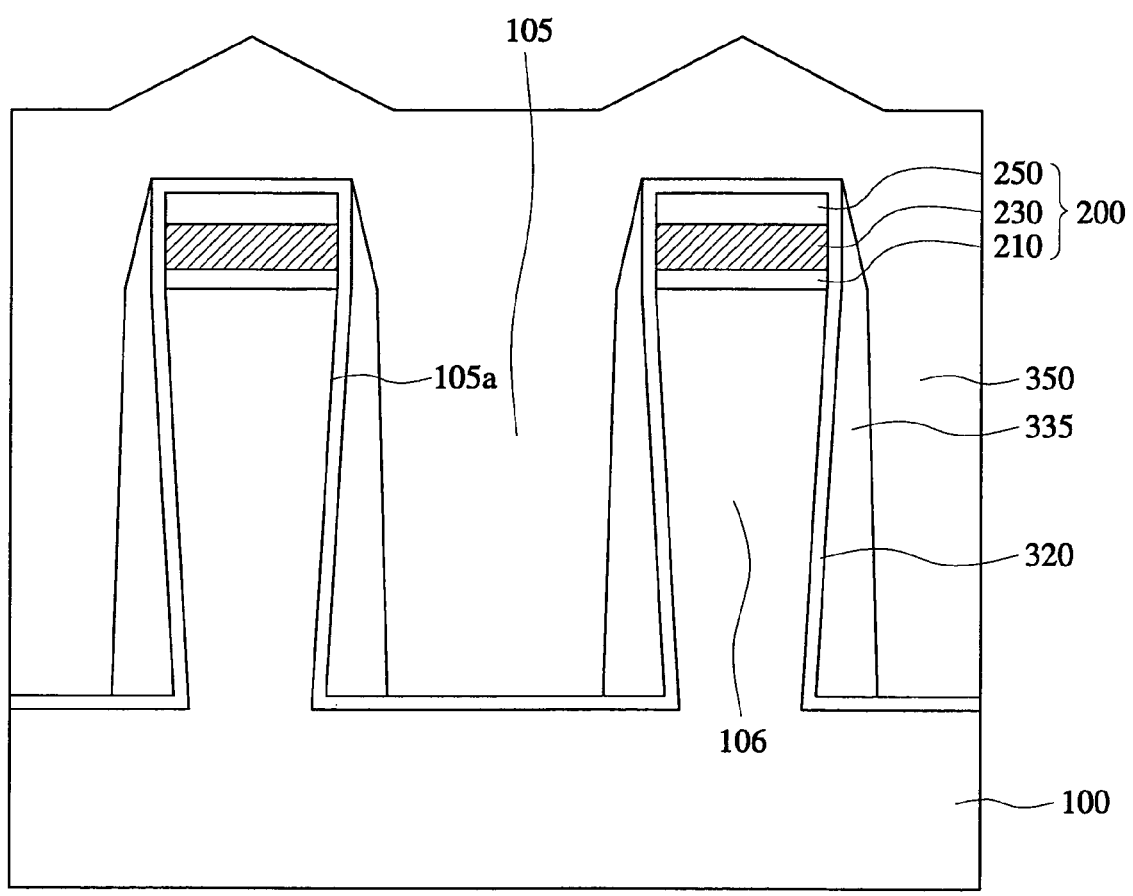

MOS TRANSISTOR WITH RECESSED GATE AND METHOD OF FABRICATING THE SAME

CROSS-REFERENCE TO RELATED APPLICATION

This application claims the benefit of Korean Patent Application No. 2003-0056264, filed on Aug. 13, 2003, the disclosure of which is hereby incorporated herein by reference in its entirety.

BACKGROUND OF THE INVENTION

1. Field of the Invention

The present invention relates to a semiconductor device and a method of fabricating the same and, more particularly, to a MOS transistor with a recessed gate and a method of fabricating the same.

2. Description of the Related Art

In general when the length of a transistor gate is reduced to a level approaching 0.1 μm or thereabout, several problems can occur. The problems that occur include rolling off of the threshold voltage, decrease of the punch-through voltage due to a short channel effect (SCE) and so on. In order to suppress the short channel effect, one can (a) reduce the junction depth of a source and a drain, or (b) increase the effective channel length. The structure of a metal oxide semiconductor (MOS) transistor with a recessed gate is such that it allows one to implement both of the above listed methods at the same time.

FIG. 1 is a plan view of a typical MOS transistor with a recessed gate. Referring to FIG. 1, an active region 11 is defined by a trench isolation layer 11a formed in a semiconductor substrate. A recessed gate 30 is formed to intersect the active region 11. One portion of the active region 11 adjacent to the gate 30 is a source region 13, and another portion of the active region 11 at the other side of gate 30 is a drain region 15. One portion of the active region 11 which is overlapped by the gate 30 is a channel region 17.

FIGS. 2 and 3 are sectional views which illustrate the structure of the MOS transistor taken along the lines of I–I' and II–II' of FIG. 1 respectively. Referring to FIG. 2, the recessed gate 30 is located in a shallow trench formed in a semiconductor substrate 10. The active regions adjacent to the recessed gate 30 are the source region 13 and the drain region 15, and the active region under the recessed gate 30 is the channel region 17. A gate insulating layer 20 is interposed between the recessed gate 30 and the channel region 17. The depth of the recessed gate 30 is deeper than the depth of the source/drain region 13, 15, therefore the effective channel length L can be lengthened.

Referring to FIG. 3, the channel region 17 is located between the trench isolation layers 11a. The source region 13 (FIG. 1) and the drain region 15 (FIG. 1) are located at the front and the back of the channel region 17 respectively, and the recessed gate 30 is located on the channel region 17. As shown in the drawing, the recessed gate 30 has a positive slopped sidewall and the trench isolation layers 11a also have a positive slopped sidewall. As a result, as shown in FIG. 3, the above structure creates a sharp tip 17a in the channel region 17 at which the recessed gate 30 and the trench isolation layer 11a adjoin each other. Referring to FIG. 1, the sharp tip 17a is formed along the boundary between the channel region 17 and the trench isolation layer 11a. As a result, when such a MOS transistor works, a channel is formed not only under the recessed gate 30, and but also in the sharp tip 17a. The channel formed in the sharp tip 17a can reduce the effective channel length of the MOS transistor with the recessed gate 30. Therefore, the MOS transistor with the recessed gate may result in a failure to suppress the short channel effect.

SUMMARY OF THE INVENTION

Exemplary embodiments of the present invention provide a MOS transistor with a recessed gate structured for suppressing the reduction of effective channel length. The present invention also provides a method of fabricating a MOS transistor with a recessed gate structured to suppress the reduction of effective channel length.

According to one embodiment, the present invention provides a MOS transistor which includes a semiconductor substrate, and a trench isolation layer located in a predetermined region of the semiconductor substrate for defining an active region. The trench isolation layer has a negative slope on at least a lower sidewall thereof. A recessed gate is located in a predetermined region of the active region, and a bottom surface of the recessed gate is placed adjacent or contacts the negatively slopped sidewall of the trench isolation layer.

The overall sidewall including the lower sidewall of the trench isolation layer may have a negative slope. However, alternatively, the trench isolation layer may have a positive slope on its upper sidewall and a negative slop on the lower sidewall. The trench isolation layer is preferably formed of high-density plasma chemical vapor deposition (HDP-CVD) insulating layer.

A gate insulating layer may be interposed between the recessed gate and the active region and the recessed gate may be formed of polysilicon.

The present invention provides a method of fabricating a MOS transistor. The method comprises first preparing a semiconductor substrate. An isolation trench having a negative slope on at least a lower sidewall is formed in a predetermined region of the semiconductor substrate to define an active region. The isolation trench is filled with an insulating layer, and the semiconductor substrate having the isolation trench filled with the insulating layer is polished by using a CMP so as to form a trench isolation layer. A recessed gate is formed in a predetermined region of the active region, and a bottom surface of the recessed gate is placed adjacent or contacts the negatively slopped lower sidewall of the trench isolation layer.

The isolation trench may be formed so as to have a negative slope on the overall sidewall including the lower sidewall. Alternatively, the isolation trench may be formed to have a positive slope on its upper sidewall and a negative slope on its lower sidewall.

In the process of forming the isolation trench, negative-slope etching may be employed when the sidewall is formed. The negative-slope etching may be performed by a dry etching or a wet etching. The dry etching may be performed by using a substrate etching gas including $NF_3$ and $SF_6$.

Before the isolation trench is filled with the insulating layer, a liner is preferably formed inside the isolation trench. The filling of the isolation trench with the insulating layer may include partially filling the isolation trench with a first insulating layer. The first insulating layer is anisotropically etched to form an insulating spacer on the negatively slopped lower sidewall of the isolation trench. The isolation trench having the insulating spacer is substantially completely filled with a second insulating layer.

The first and second insulating layer is can be formed of an HDP-CVD insulating layers. The anisotropically etching of the first insulating layer can be performed by using a reactive ion etching (RIE) process. The insulating spacer can be formed to cover at least the negatively slopped lower sidewall.

In the process of forming the recessed gate, a channel trench may be formed in a predetermined region of the active region such that the bottom surface of the channel trench contacts a negatively slopped lower sidewall of the trench isolation layer. A gate insulating layer is formed on the bottom surface of the channel trench, and a gate conductive layer is formed on the gate insulating layer to fill the channel trench. Then, the gate conductive layer is patterned. Before forming the gate insulating layer, it is preferable to include a process of performing a channel ion implantation process onto the channel trench. The gate conductive layer may be formed of polysilicon.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 5a to 5f are sectional views to illustrate a method of fabricating a MOS transistor according to a first embodiment of the present invention taken along the line of I–I' of FIG. 4.

DETAILED DESCRIPTION OF THE INVENTION

Figure 1:
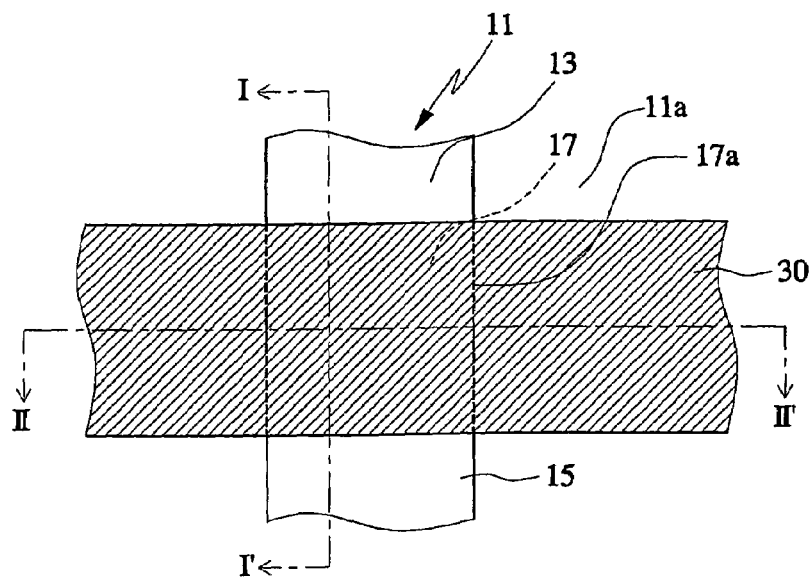
FIG. 1 is a plane view of a typical MOS transistor with a recessed gate.
Figure 2:
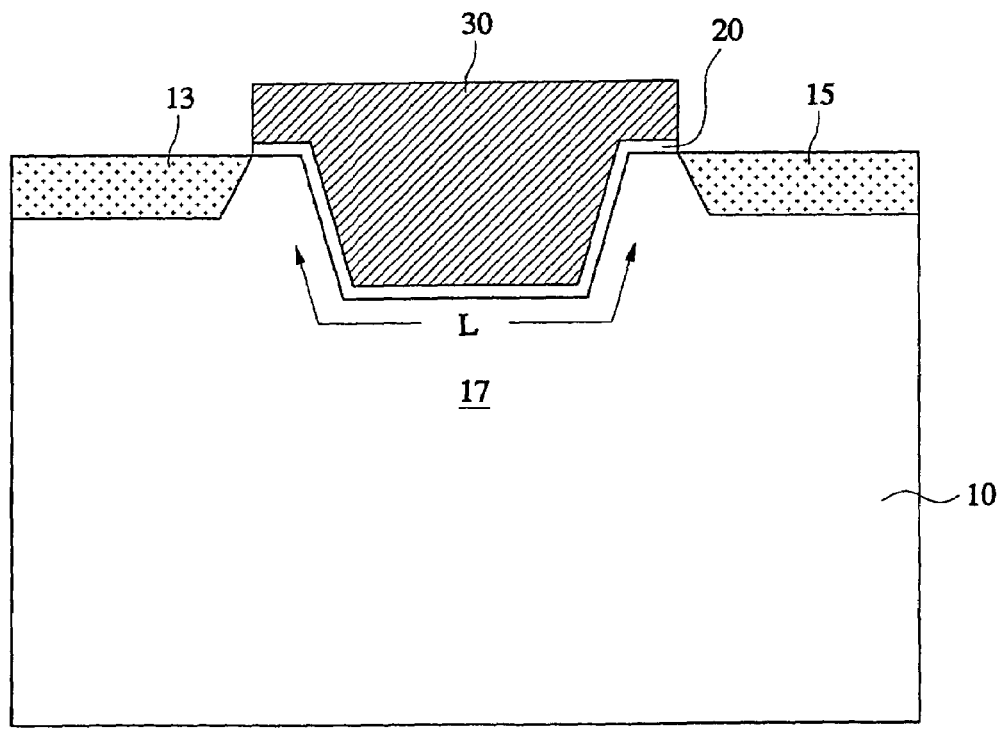
FIG. 2 is a sectional view to illustrate the structure of a MOS transistor taken along the line of I–I' of FIG. 1.

The present invention will now be described more fully hereinafter with reference to the accompanying drawings, in which preferred embodiments of the invention are shown. This invention may, however, be embodied in different forms and the invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 4:
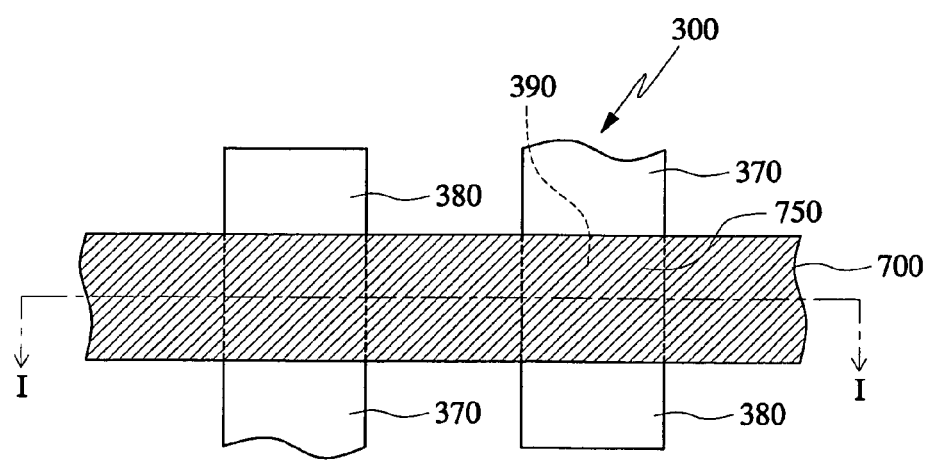
FIG. 4 is a plane view to illustrate a part of a typical DRAM cell array region employing a MOS transistor with a recessed gate.

FIG. 4 is a plan view of a part of a typical DRAM cell array region employing a MOS transistor with a recessed gate. Referring to FIG. 4, an active region 300 is defined by a trench isolation layer located in a semiconductor substrate. A word line 700 intersects the active region 300. A portion of the active region 300, adjacent to the word line 700, is a source region 380, and another portion of the active region 300, on the other opposite side to the source region 380, is a drain region 370. Further, a portion of the active region 300, overlapped by the word line 700, is a channel region 390. The channel region 390 is recessed into the semiconductor substrate, and a recessed gate 750, which is a part of the word line 700, is located on the recessed channel region 390.

FIGS. 5a to 5f are sectional views to illustrate the processing sequences of a method of fabricating a MOS transistor according to a first embodiment of the present invention taken along the line of I–I' of FIG. 4.

Figure 5A:
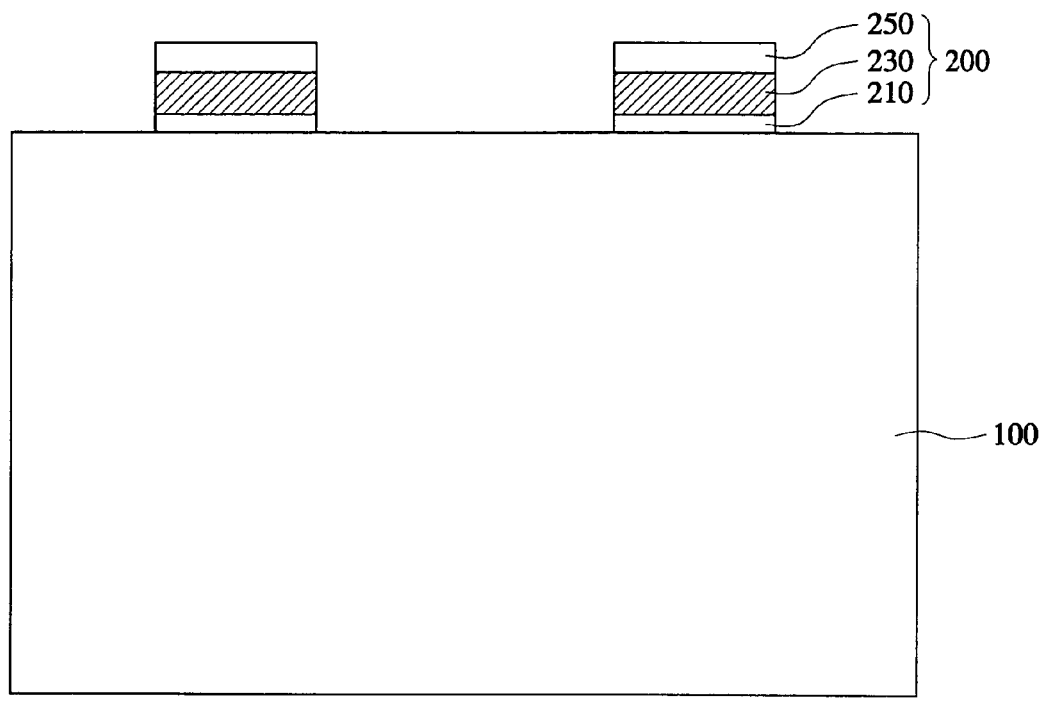

Referring to FIG. 5a, a hard mask pattern 200 including a pad oxide layer 210, a polishing stop layer 230, and an oxide layer 250 are sequentially stacked on a semiconductor substrate 100. The hard mask pattern 200 exposes a portion of a semiconductor substrate 100.

The pad oxide layer 210 functions as a buffer layer for alleviating the stress applied on the substrate 100, which occurs during the formation of the polishing stop layer 230 on the substrate 100. The pad oxide layer 210 can be formed of a thermal oxide layer to a thickness of 20 to 200 Å. The polishing stop layer 230 is used as a polishing stop point during a subsequent chemical mechanical polishing (CMP) process, and it may be formed of silicon nitride. The polishing stop layer 230 is formed to a thickness of several hundreds to approximately 1000 Å. The oxide layer 250 is formed so that the hard mask pattern 200 including the oxide layer 250 has a uniform pattern width. The oxide layer 250 can be omitted.

Figure 5B:
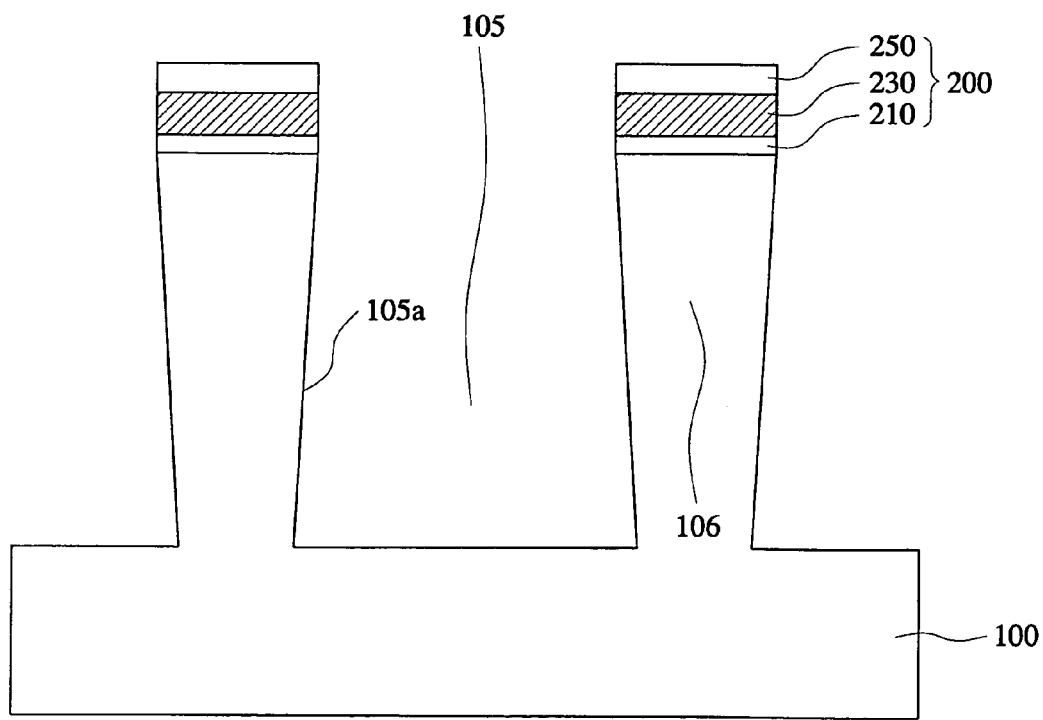

Referring to FIG. 5b, an isolation trench 105 is formed by etching the exposed portion of the substrate 100 so as to define an active region 106. The active region 106 corresponds to the channel region 390 of FIG. 4. The isolation trench 105 is formed so as to have a negative slope at least on its lower sidewall. In this embodiment, the overall sidewall 105a of the isolation trench 105 is formed to have a negative slope. As used herein the phrase, "the sidewall of isolation trench has a negative slope" may mean that the width of the isolation trench 105 surrounded by the sidewall is increased toward the lower portion of the isolation trench 105.

The isolation trench 105 is formed using a negative-slope etching so that the sidewall 105a has a negative slope. The negative-slope etching can be performed by dry etching or by a wet etching, but dry etching is preferable. Furthermore, in the dry etching, it is preferable to employ a substrate etching gas including $NF_3$ and $SF_6$.

Figure 5C:
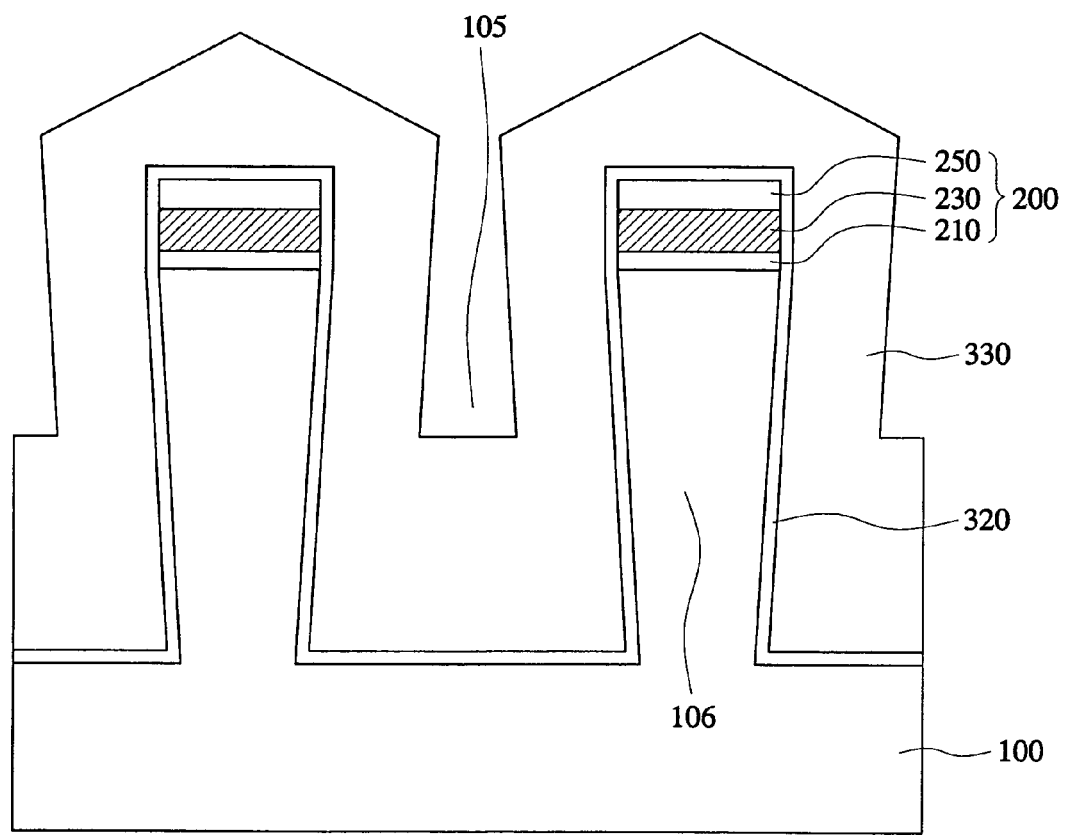

Referring to FIG. 5c, a thermal oxide layer (not shown) is preferably formed on the bottom and the sidewall of the isolation trench 105 by performing a thermal treatment on the substrate 100 having the isolation trench 105 formed therein. The thermal oxide layer cures the damage to the substrate 100 when the isolation trench 105 is formed.

A liner 320 can be formed on the substrate 100 having the thermal oxide layer. The liner 320 covers the sidewall and the bottom surface of the isolation trench 105. The liner 320 is a layer having excellent oxidation-resistant characteristics. The liner 320 can be a nitride layer, for example.

A first insulating layer 330 is formed to partially fill the isolation trench 105 having the liner 320. The first insulating layer 330 may be a layer having an excellent gap-fill characteristic. Preferably, the first insulating layer 330 is formed of HDP-CVD insulating layer. Preferably, a HDP- CVD insulating layer is a HDP-CVD oxide layer. The HDP-CVD oxide layer is known to have an excellent gap-fill characteristic.

Referring to FIG. 5d, the first insulating layer 330 is anisotropically etched to form an insulating spacer 335 on the negatively slopped sidewall 105a. During that time, the bottom surface of the isolation trench 105 may be exposed. The etching of the first insulating layer 330 is preferably performed by using an RIE process. Further, the insulating spacer 335 is preferably formed to cover the negatively slopped sidewall 105a.

A second insulating layer 350 is formed on the substrate 100 such that the insulating spacer 335 substantially completely fills the isolation trench 105. The second insulating layer 350 is also a layer having an excellent gap-fill characteristic. Preferably, the second insulating layer 350 is HDP-CVD insulating layer. Preferably, HDP-CVD insulating layer is formed of HDP-CVD oxide.

In general, the isolation trench is formed such that its sidewall has a positive slope. That is, the isolation trench is formed such that its width surrounded by the sidewall is decreased as it goes further toward the lower portion of the isolation trench 105, thereby minimizing the generation of voids when the isolation trench 105 is filled with an insulating layer. If the isolation trench 105 is formed such that the overall sidewall of the isolation trench has a negative slope, the voids may be generated when the isolation trench 105 is filled with an insulating layer.

Therefore, as described above, the insulating spacer 335 is formed on the negatively slopped sidewall 105a of the isolation trench 105 such that the width of the opening in the isolation trench 105, left by the insulating spacer 335, is reduced toward the lower portion of the isolation trench 105. As a result, the isolation trench 105 can be filled with the second insulating layer 350 without voids.

Figure 5E:
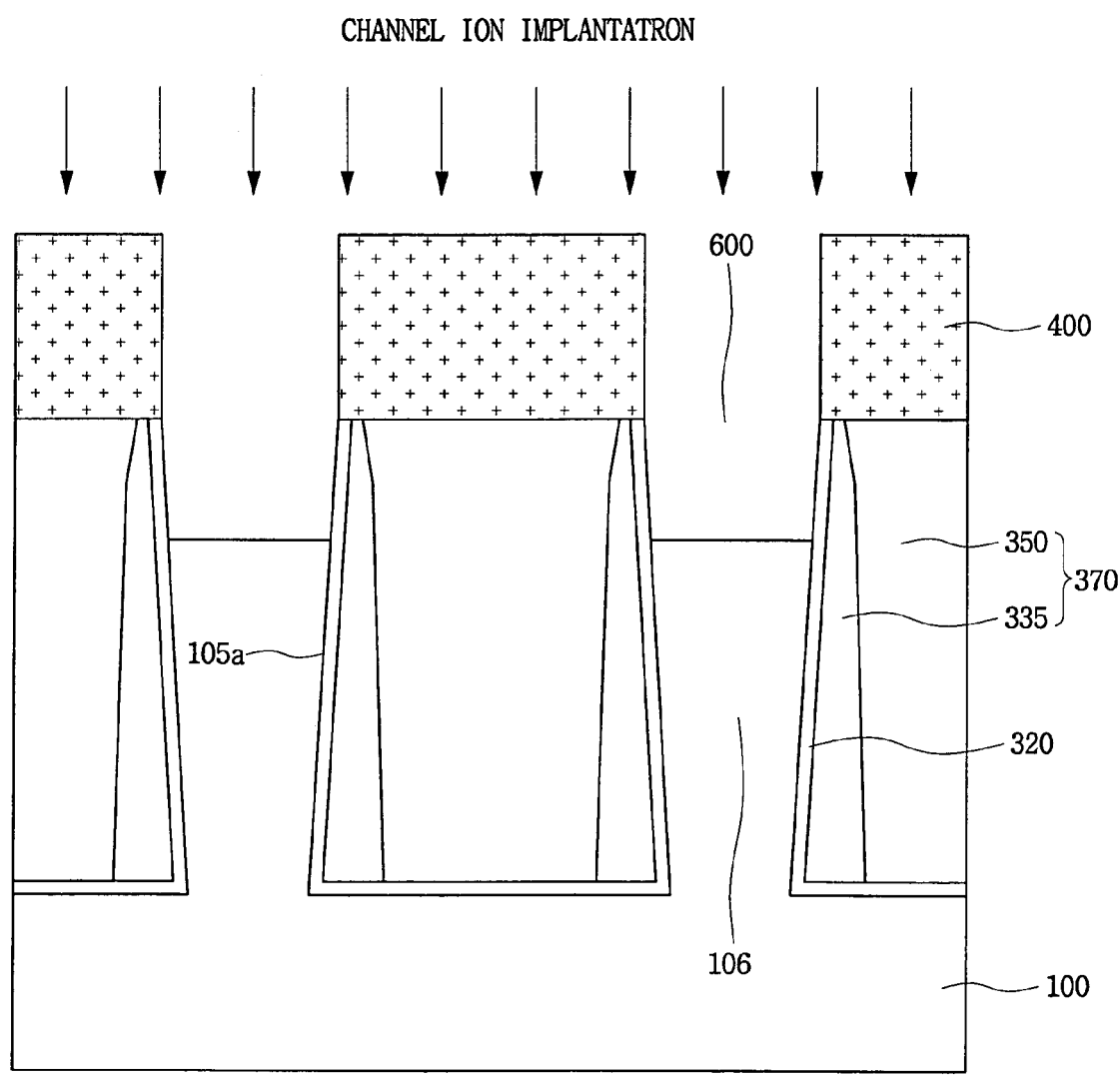

Referring to FIG. 5e, the substrate 100 having the isolation trench filled with the second insulating layer 350 is planarized through a CMP process so as to expose the polishing stop layer 230. Then, a trench isolation layer 370 is formed by removing the exposed polishing stop layer 230 and the pad insulating layer 210 under the polishing stop layer 230.

Then, a photoresist pattern 400 is formed on the substrate 100 having the trench isolation layer 370 to expose the active region of the substrate 100, that is, a channel region 106. The exposed channel region 106 is etched using the photoresist pattern 400 as an etch mask to form a channel trench 600, and the bottom surface of the channel trench 600 is formed adjacent the negatively slopped sidewall 105a of the trench isolation layer 370. The channel trench 600 is preferably formed by using a de-coupled plasma source (DPS).

Next, a channel ion implantation into the channel trench 600 is performed using the photoresist pattern 400 as a mask. The channel ion implantation is performed to control a threshold voltage as known in the art.

Figure 5F:
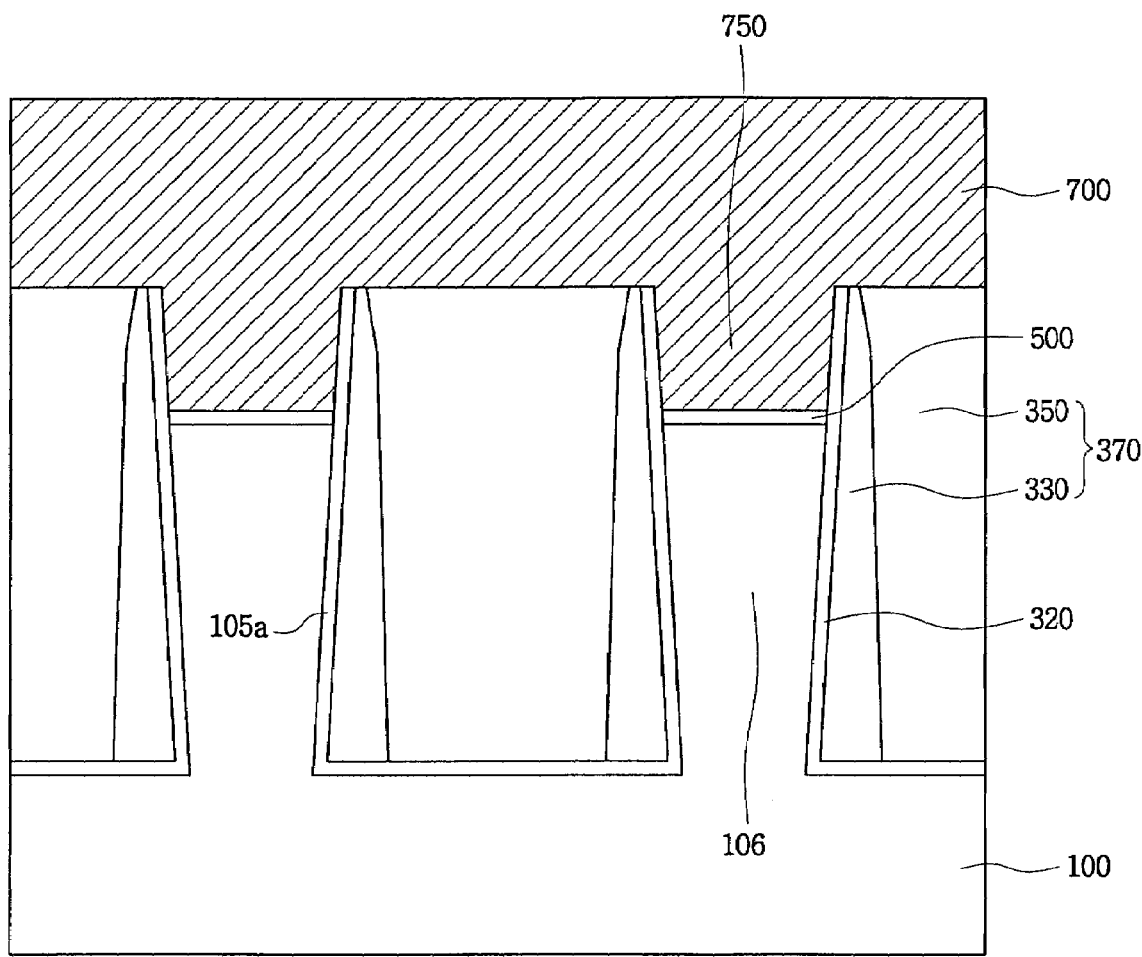

Referring to FIG. 5f, the photoresist pattern 400 is removed to expose the top portion of the trench isolation layer 370. Next, the substrate 100 is thermally oxidized to form a gate insulating layer 500 on the bottom surface of the channel trench 600. A gate conductive layer is formed on the gate insulating layer 500 to fill the channel trench 600. The gate conductive layer may be formed of polysilicon. Then, the gate conductive layer is patterned to form a recessed gate 750, whereby the source region 380 (FIG. 4) and the drain region 370 (FIG. 4) is exposed. A bottom surface of the recessed gate 750 is located adjacent the negatively slopped sidewall 105a. The recessed gate 750 is extended on the trench isolation layer 370 to form a word line 700.

Finally, the formation of the MOS transistor is completed by performing an ion implantation process onto the exposed source region 380 (FIG. 4) and the exposed drain region 370 (FIG. 4), which are located on the front and the back of the channel region 106, respectively.

Figure 6A:
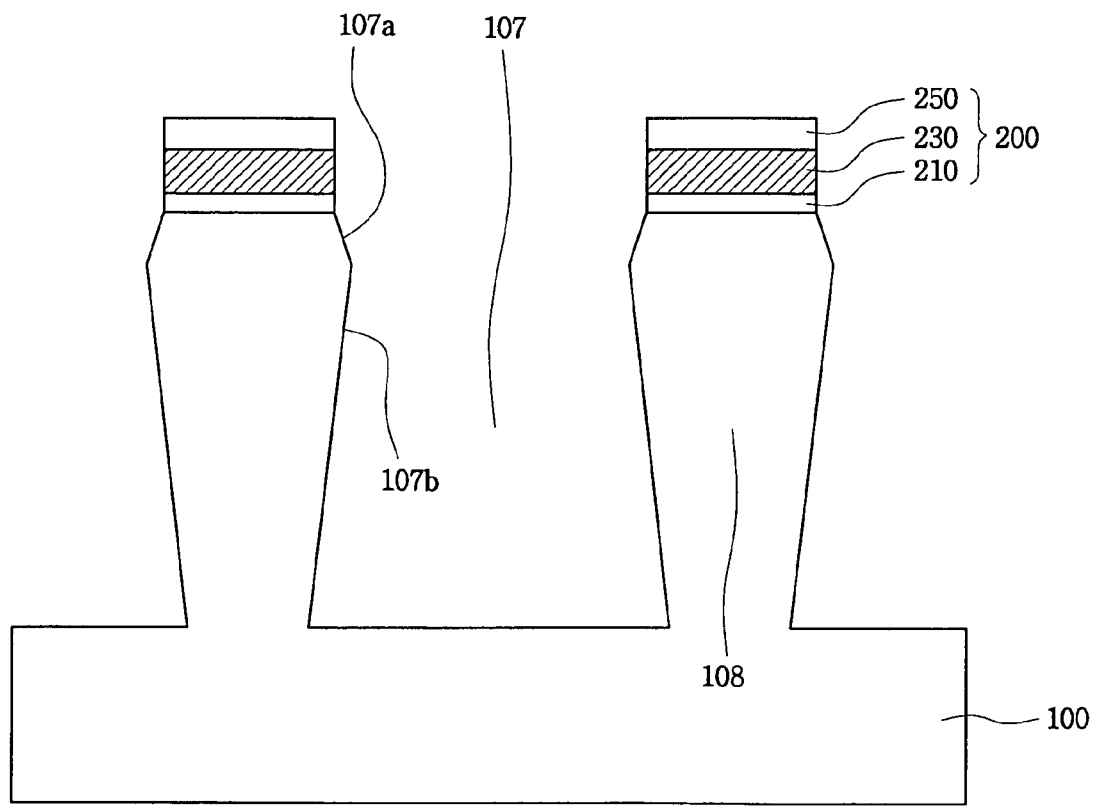
FIGS. 6a to 6c are sectional views to illustrate a method of fabricating a MOS transistor according to a second embodiment of the present invention taken along the line of I–I' of FIG. 4.
Figure 6B:
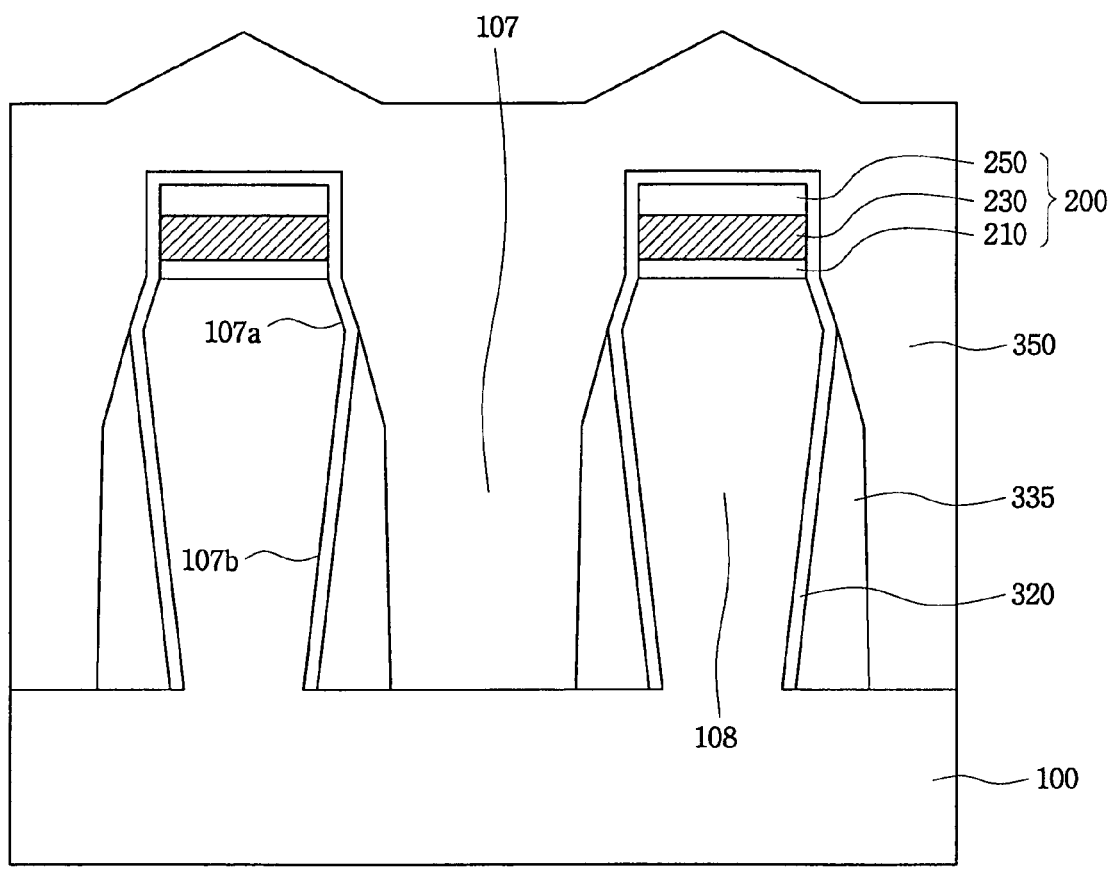
Figure 6C:
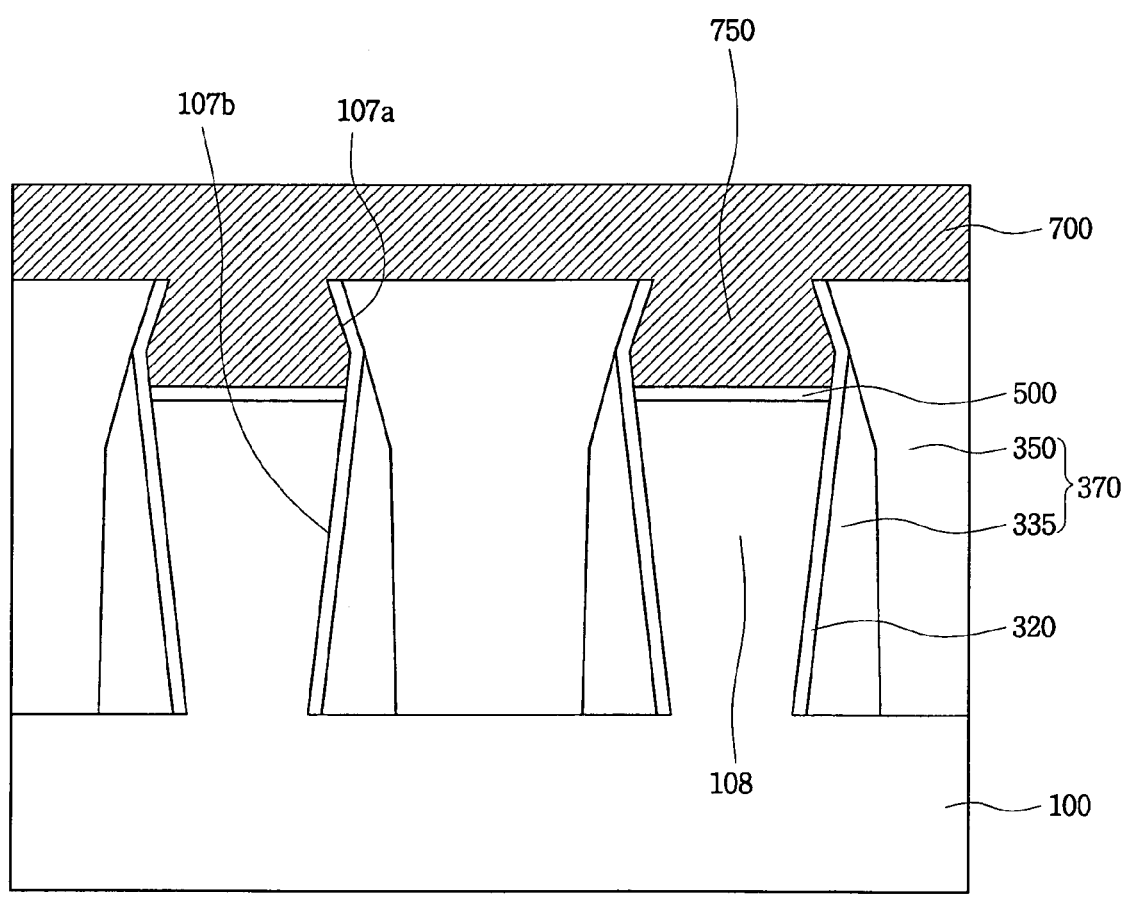

FIGS. 6a to 6c are sectional views to illustrate a method of fabricating a MOS transistor according to a second embodiment of the present invention taken along line of I–I' of FIG. 4. The method of fabricating the MOS transistor according to a second embodiment of the present invention is the same as the method explained in the first embodiment except the explanation to be described as follows.

Referring to FIG. 6a, the semiconductor substrate 100 is etched to form an isolation trench 107, using the hard mask patterns 200 formed on the substrate 100, and at the same time, an active region i.e. channel region 108 is defined. The hard mask patterns 200 includes a pad oxide layer 210, a polishing stop layer 230, and an oxide layer 250, which are sequentially stacked. The isolation trench 107 is formed to have a negative slope at least on its lower sidewall. In this embodiment, the isolation trench 107 is formed to have a positive slope on its upper sidewall 107a and a negative slope on the rest of its sidewall i.e. lower sidewall 107b. The formation of the negative slope on the lower sidewall 107b is preferably made by using a negative-slope etching as described in the first embodiment.

Referring to FIG. 6b, preferably, the substrate 100 having the isolation trench 107 is thermally treated to form a thermal oxide layer (not shown) on the bottom and the sidewall of the isolation trench 107. A liner 320 can be formed on the substrate 100 having the thermal oxide layer. Then, a first insulating layer is formed on the liner 320 to partially fill the isolation trench 107. The first insulating layer is anisotropically etched to form an insulating spacer 335 on the negatively slopped lower sidewall 107b. The bottom surface of the isolation trench 107 may be exposed at the same time. The insulating spacer 335 is preferably formed to cover at least the negatively slopped lower sidewall 107b. The anisotropically etching of the first insulating layer is performed by using a RIE process.

Then, a second insulating layer 350 is formed on the substrate 100 having the insulating spacer 335 to substantially completely fill the isolation trench 107. When forming the insulating spacer 335 on the negatively slopped lower sidewall 107b of the isolation trench 107, the width of the opening left in the isolation trench 107 by the insulating spacer 335 is formed so as to be reduced toward the lower portion of the isolation trench 107. Therefore, the possibility of the void generation is reduced, and the isolation trench 107 can be filled with the second insulating layer 350 without voids.

Referring to FIG. 6c, the substrate 100 having the second insulating layer 350, is planarized using a chemical mechanical polishing (CMP) process to expose the polishing stop layer 230. Then, the exposed polishing stop layer 230 and the pad insulating layer 210 under the exposed polishing stop layer 230 are removed to form a trench isolation layer 370.

A channel trench is formed in a predetermined region of the active region i.e. channel region 108 of the substrate 100 having the trench isolation layer 370. The channel trench is formed such that its bottom surface is located adjacent the negatively slopped lower sidewall 107b of the trench isolation layer 370. The channel trench is preferably formed by using a de-coupled plasma source (DPS).

A gate insulating layer 500 is formed on the bottom surface of the channel trench. A gate conductive layer is formed on the gate insulating layer 500 to fill the channel trench. By patterning the gate conductive layer to form a recessed gate 750, the source region 380 (FIG. 4) and the drain region 370 (FIG. 4) are exposed. The recessed gate 750 is extended on the trench isolation layer 370 to form a word line 700.

A bottom surface of the recessed gate 750 is positioned adjacent the negatively slopped lower sidewall 107b. In general, a depth of the recessed gate 750 is dependent on the type of a semiconductor device. Therefore, in the formation of the isolation trench 107, the location of adjoining point of the positively slopped upper sidewall 107a and the negatively slopped lower sidewall 107b can be controlled so that the bottom surface of the recessed gate 750 may be placed adjacent the negatively slopped lower sidewall 107b.

Figure 3:
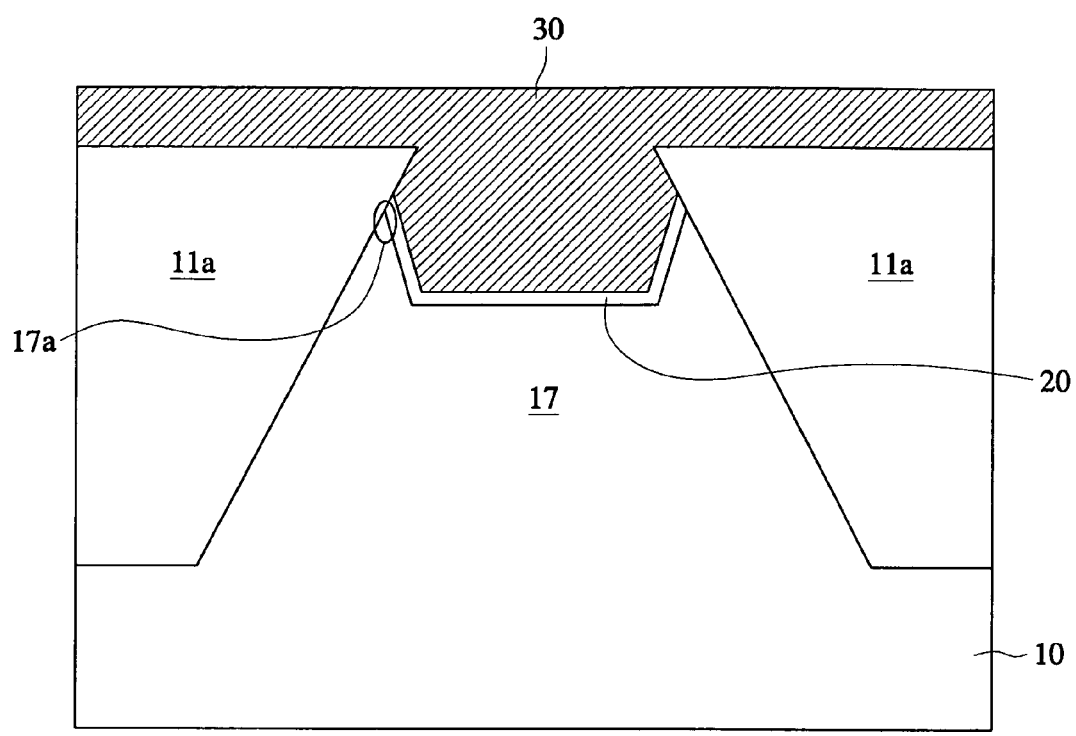
FIG. 3 is a sectional view to illustrate the structure of a MOS transistor taken along the line of II–II' of FIG. 1.

As described above, the trench isolation layer 370 (FIG. 5f, FIG. 6c) is formed such that at least its lower sidewall 105a (FIG. 5f), 107b (FIG. 6c) has a negative slope, and the bottom surface of the recessed gate 750 is placed acjacent the negatively slopped lower sidewall 105a (FIG. 5f), 107b (FIG. 6c). As a result, a sharp tip (referring to 17a of FIG. 3) is not generated between the recessed gate 750 and the trench isolation layer 370. Therefore, when the MOS transistor with the recessed gate 750 works, a channel is formed only under the recessed gate 750. Consequently, the reduction of an effective channel length due to the sharp tip (referring to 17a of FIG. 3) can be avoided. Furthermore, a short channel effect such as rolling off of a threshold voltage of a MOS transistor, or punch through can be effectively suppressed.

While the present invention has been particularly shown and described with reference to an exemplary embodiment thereof, it will be understood by those of ordinary skill in the art that various changes in form and details may be made therein without departing from the spirit and scope of the invention as defined by the appended claims and their equivalents.

What is claimed is:

1. A MOS transistor comprising:
   a semiconductor substrate;
   a trench isolation layer located in the semiconductor substrate for defining an active region, the trench isolation layer having a negative slope on the entire sidewall thereof; and
   a recessed gate located in the active region, a bottom surface of the recessed gate placed adjacent the negatively sloped sidewall of the trench isolation layer.

2. The MOS transistor according to claim 1, wherein the trench isolation layer has a negative slope on the overall sidewall including a lower sidewall.

3. The MOS transistor according to claim 1, wherein the trench isolation layer is formed of HDP-CVD insulating layer.

4. The MOS transistor according to claim 1, further comprising a gate insulating layer interposed between the recessed gate and the active region.

5. The MOS transistor according to claim 1, wherein the recessed gate is formed of polysilicon.

6. The MOS transistor according to claim 1, wherein a sidewall of the recessed gate is positively sloped to correspond to the negatively sloped sidewall of the trench isolation layer.

7. The MOS transistor according to claim 1, wherein the bottom surface of the recessed gate is surrounded by the trench isolation layer.

8. The MOS transistor according to claim 1, wherein a recessed portion of the recessed gate is directly over at least a portion of the trench isolation layer.

9. The MOS transistor according to claim 1, further comprising a channel region below the recessed gate.

* * * * *